(12) United States Patent
Tsai et al.

(10) Patent No.: US 9,035,711 B2
(45) Date of Patent: *May 19, 2015

(54) ASK MODULATOR AND TRANSMITTER HAVING THE SAME

(75) Inventors: Chun-Liang Tsai, Pingtung (TW); Shao-Chang Chang, Jhubei (TW)

(73) Assignee: FAVEPC INC., Jhubei (TW)

( * ) Notice: Subject to any disclaimer, the term of this patent is extended or adjusted under 35 U.S.C. 154(b) by 113 days.

This patent is subject to a terminal disclaimer.

(21) Appl. No.: 13/422,624

(22) Filed: Mar. 16, 2012

(65) Prior Publication Data

US 2013/0243120 A1 Sep. 19, 2013

(51) Int. Cl.
*H03C 1/62* (2006.01)
*H03C 1/00* (2006.01)
*H04L 27/04* (2006.01)
*H03K 7/02* (2006.01)
*G06K 19/07* (2006.01)

(52) U.S. Cl.
CPC .. *H03C 1/62* (2013.01); *H03C 1/00* (2013.01); *H04L 27/04* (2013.01); *H03K 7/02* (2013.01); *G06K 19/0723* (2013.01)

(58) Field of Classification Search
USPC ........ 331/149, 155, 176, 177; 340/10.1, 10.3, 340/10.5; 375/300, 309, 315
See application file for complete search history.

(56) References Cited

U.S. PATENT DOCUMENTS

| 6,078,226 | A  | * | 6/2000 | Ajjikuttira | .................... 331/179 |
| 6,208,217 | B1 | * | 3/2001 | Miyaura | ....................... 332/152 |
| 6,529,562 | B1 | * | 3/2003 | Muraishi | ...................... 375/300 |
| 7,689,195 | B2 | * | 3/2010 | Wu et al. | ........................ 455/336 |
| 7,965,792 | B2 | * | 6/2011 | Kim et al. | ..................... 375/300 |
| 2002/0077061 | A1 | * | 6/2002 | Charrat | .......................... 455/41 |
| 2008/0084277 | A1 | * | 4/2008 | Korekoda | ................... 340/10.1 |

FOREIGN PATENT DOCUMENTS

JP 2005018404 A * 1/2005

* cited by examiner

*Primary Examiner* — Ryan Johnson
(74) *Attorney, Agent, or Firm* — Alston & Bird LLP

(57) ABSTRACT

A modulator which has a first terminal to receive a carrier signal, a second terminal to receive a first control signal to control a frequency band of the carrier signal and a third terminal to receive a second control signal to control a modulation depth of the carrier signal.

17 Claims, 7 Drawing Sheets

ASK MODULATOR AND TRANSMITTER HAVING THE SAME

BACKGROUND OF THE INVENTION

The present invention relates generally to an amplitude shift keying (ASK) modulator in a radio-frequency identification (RFID) system and, more particularly, to a transmitter having the same in an RFID system.

RFID technology is widely used in various applications such as electronic payment, security and stock inventorying, etc. A typical RFID system includes a reader, a tag and a database platform.

ASK modulation is one of the most popular schemes to be used in RFID communication. FIG. 1A illustrates an ASK modulation scheme. Referring to FIG. 1A, a signal S1 which has an amplitude "A" may be modulated to be a signal S2 having an amplitude "B." A critical parameter so called modulation depth in ASK modulation is defined as follows:

$$\text{Modulation depth} = \frac{(A - B)}{A} \cdot 100\%.$$

Generally, the modulation depth may have to be above 90%, if not, there may be an electromagnetic radiation problem.

FIG. 1B illustrates another ASK modulation scheme. Referring to FIG. 1B, a signal S3 which has an amplitude "A'" may be modulated to be a signal S4 having an amplitude "B'," while B'=0 in this example. The modulation depth in this example in accordance with the above equation is 100%, i.e. the so called on-off keying (OOK). In such case, an external tag may not work because the received signal S4 has no power to activate the tag. Accordingly, it is crucial to control the modulation depth in an RFID system.

FIG. 1C is a schematic diagram of a conventional ASK modulator. Referring to FIG. 1C, an ASK modulator 1 includes an oscillator 10, a buffer amplifier 11, a modulation means 12, a band pass filter 13, an antenna 14 and a low pass filter 15. The modulation means 12 further includes a p-intrinsic-n (PIN) diode modulator 121, a power amplification circuit 122 and a voltage-current conversion circuit 123.

The PIN diode modulator 121 may inevitably generate noise or spurious radiation components which may be amplified by the power amplification circuit 122. Therefore, the band pass filter 13 to eliminate the undesired noise or spurious radiation components is indispensable for the ASK modulator. Moreover, the low pass filter 15 may receive a digital signal from a terminal "a" and generate analog signal to control the modulation means 12, which means that the modulation means 12 may be controlled by only two voltage levels, i.e. high (VDD) and low (Ground) levels. Accordingly, the low pass filter 15 is a critical element in the ASK modulator 1. However, the use of low pass filter 15 and the band pass filter 13 may increase the cost of the ASK modulator 1.

Moreover, the PIN diode (not shown) of the PIN diode modulator 121 is an active component, which may result in noise signals. However, such undesired noise signals may not be eliminated but amplified by the power amplification circuit 122.

Furthermore, a PIN diode may not be integrated into a chip with other electronic components of an ASK modulator. FIG. 1D is a schematic diagram of a conventional ASK modulator 1'. Referring to FIG. 1D, the ASK modulator 1' includes an oscillator 10', a buffer amplifier 11', a control circuit 16', a PIN diode modulator 121', a power amplifier 122' and an antenna 14'. The control circuit 16' may include a micro control unit (not shown) and/or a digital processor (not shown). The buffer amplifier 11', the control circuit 16' and the power amplifier 122' may be integrated into a chip to form an integrated circuit (IC) 17'. As shown in FIG. 1D, the IC 17' has five pins t1, t2, t3, t4 and t5, wherein pin t1 receives carrier signals from the oscillator 10'; pin t2 connects the output of the buffer amplifier 11' to the PIN diode modulator 121'; pin t3 is used to send a control signal to the PIN diode modulator 121'; pin t4 connects the PIN diode modulator 121' to the input of the power amplifier 122'; and pint t5 connects the output of the power amplifier 122' to the antenna 14'. The extra pins t2 and t4 of the IC 17' may cause more harmonics or spurious signals and also increase the package cost of the ASK modulator 1'.

It may therefore desirable to have a cost efficient modulator with a simplified circuit.

BRIEF SUMMARY OF THE INVENTION

Examples of the present invention may provide a modulator, the modulator has a first terminal to receive a carrier signal, a second terminal to receive a first control signal to control a frequency band of the carrier signal and a third terminal to receive a second control signal to control a modulation depth of the carrier signal.

Some examples of the present invention may also provide a transmitter, the transmitter includes a carrier generator for generating a carrier signal, an amplification having an input terminal connected to the carrier generator, a modulator having a first terminal connected to an output of the amplification circuit; and an antenna having an input connected to the modulator.

Some examples of the present invention may also provide a modulator, the modulator includes a variable resistor being provided with a voltage level; a switch connected in series to the variable resistor; a first resistor connected in parallel to the switch; a second resistor connected in series to the first resistor; a first inductor having a first terminal connected to the second resistor and a second terminal to receive a carrier signal; a PIN diode having an anode connected to the second terminal of the first inductor and an cathode to output a modulated signal; and a second inductor having a first terminal connected to the cathode of the PIN diode and a second terminal, wherein the second terminal is grounded.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

In the drawings.

DETAILED DESCRIPTION OF THE INVENTION

Reference will now be made in detail to the present examples of the invention, examples of which are illustrated in the accompanying drawings. Wherever possible, the same reference numbers will be used throughout the drawings to refer to the same or like parts.

Figure 2A:
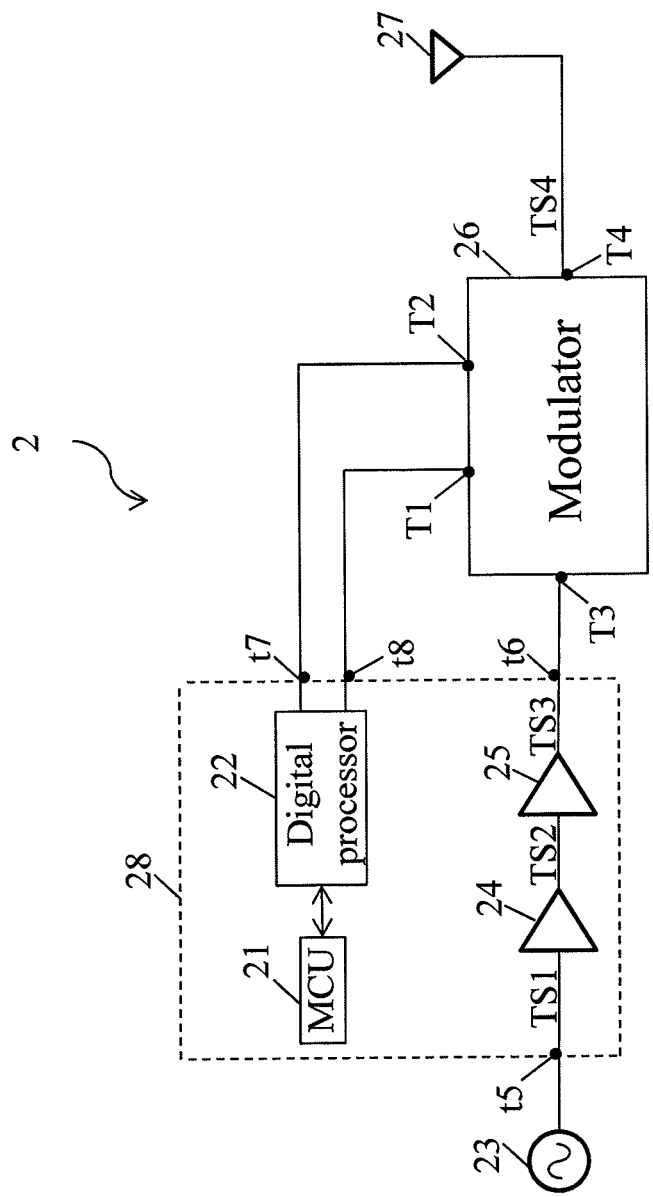
FIG. 2A is a block diagram of a transmitter 2 in an RFID system in accordance with an example of the present invention.

FIG. 2A is a block diagram of a transmitter 2 in an RFID system in accordance with an example of the present invention. Referring to FIG. 2A, the transmitter 2 may include a micro control unit (MCU) 21, a digital processor 22, a carrier generator 23, a buffer amplifier 24, a power amplifier 25, a modulator 26 and an antenna 27.

The digital processor 22 may connect to the MCU 21. The carrier generator 23 may connect to the buffer amplifier 24, which may in turn connect in series to the power amplifier 25. The modulator 26 may be connected between the power amplifier 25 and the antenna 27. The modulator 26 may also have two terminals "T1" and "T2" both connected to the digital processor 22.

The carrier generator 23 may generate a signal TS1 at a frequency $f_{ts1}$, and the signal TS1 may then be sent to the buffer amplifier 24. The buffer amplifier 24 may receive the signal TS1, then amplify the voltage of signal TS1 and in turn output an amplified signal TS2, which may be sent to the power amplifier 25. The power amplifier 25 may amplify the power of the signal TS2 and output an amplified signal TS3 to the modulator 26. In one example, the frequency $f_{ts1}$ may be but is not limited to approximately 433.92 mega hertz (MHz) and the amplifiers 24 and 25 may linearly amplify the signals TS1 and TS2. In another example, the frequency $f_{ts1}$ may be but is not limited to approximately 915 MHz.

The modulator 26 may receive the signal TS3 from the power amplifier 25 and output a modulated signal TS4 to the antenna 27. The digital processor 22, which may be subject to the MCU 21, may generate control signals and send the control signals to terminal T1 and/or terminal T2 to control the frequency band and/or modulation depth of the signal TS4. In another example, terminal T2 may not connect to the digital processor 22 but a direct current (DC) voltage source instead. The harmonics or spurious signals that may result from the modulator 26 may not be amplified since the modulator 26 is arranged in a stage next to the power amplifier 25. Accordingly, the harmonics or spurious signals resulted from the modulator 26 may be minimized to improve the transmission quality.

Figure 1A:
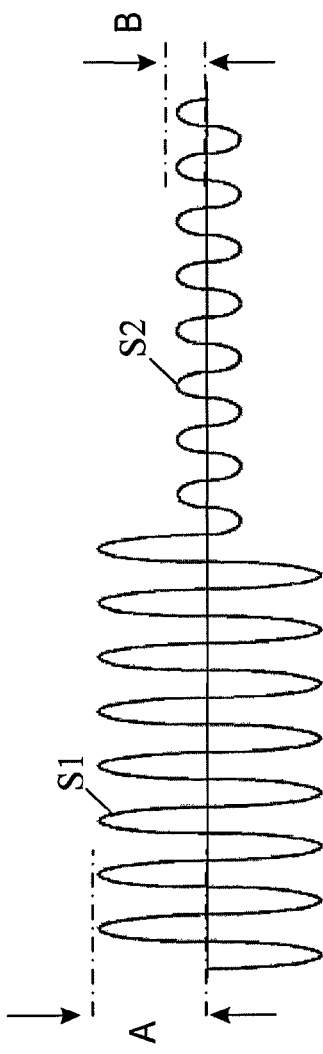
FIG. 1A illustrates an ASK modulation scheme.
Figure 1B:
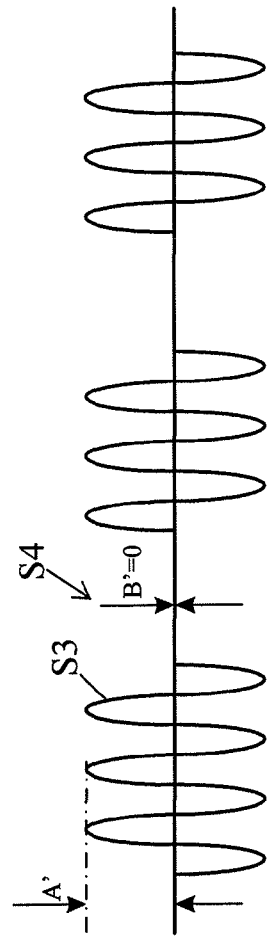
FIG. 1B illustrates another ASK modulation scheme.
Figure 1C:
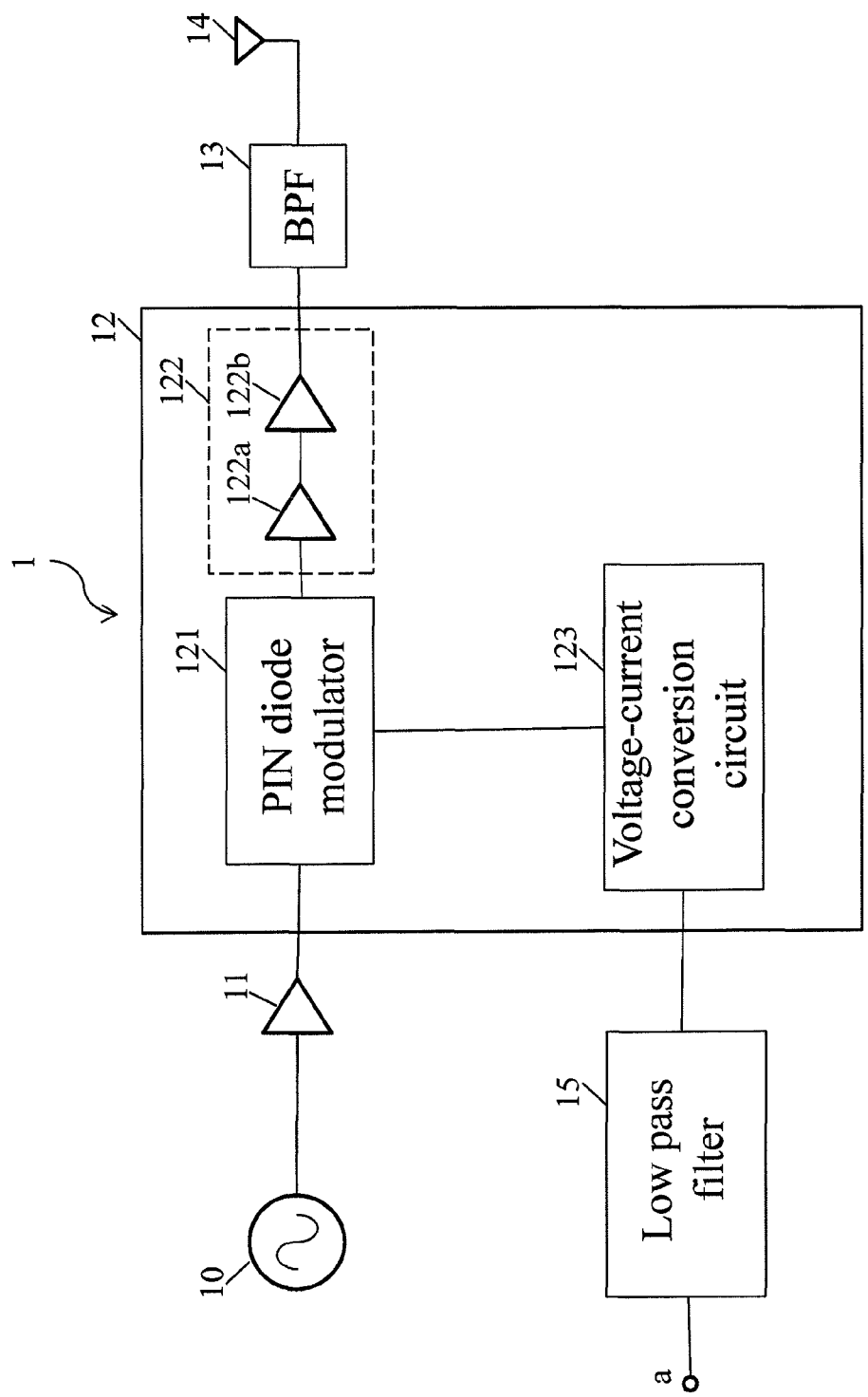
FIG. 1C is a schematic diagram of a conventional ASK modulator 1.
Figure 1D:
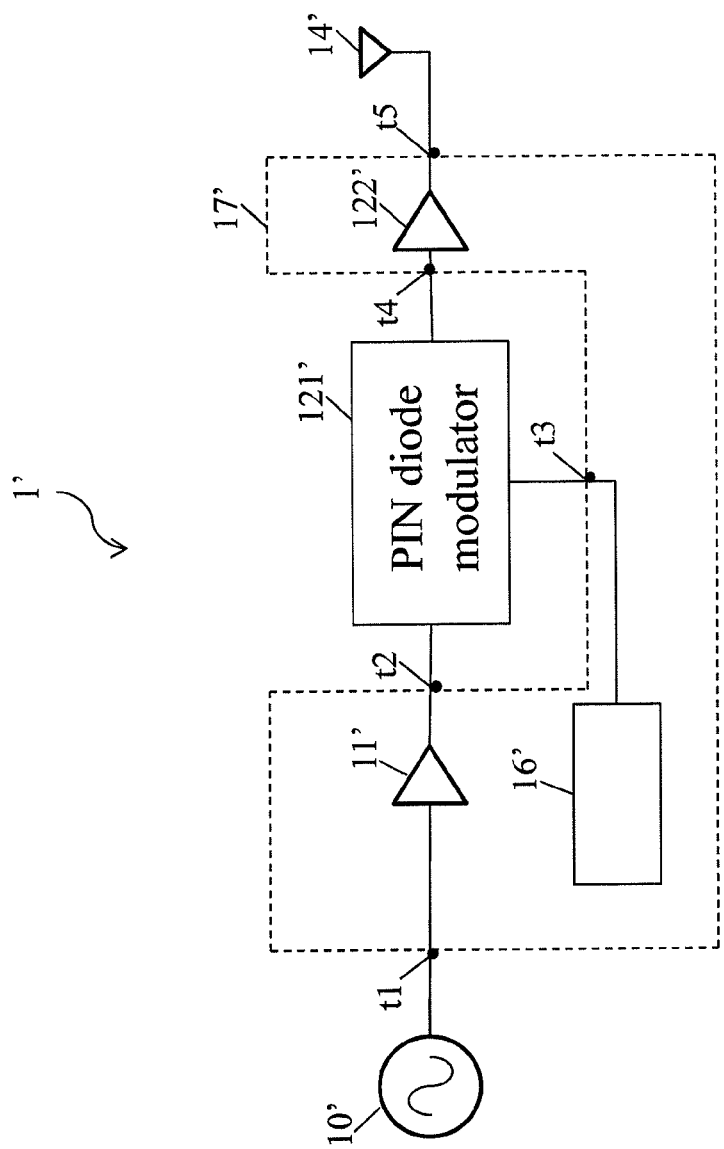
FIG. 1D is a schematic diagram of a conventional ASK modulator 1'.

Still referring to FIG. 2A, the MCU 21, the digital processor 22, the buffer amplifier 24 and the power amplifier 25 may be incorporated into an integrated circuit (IC) 28 in another example. The IC 28 may include a pin t5 to receive the signal TS1 from the carrier generator 23 and another pin t6, which may be connected to a terminal T3 of the modulator 26, to transmit the signal TS3. The IC 28 may also include pins t7 and t8 which may be connected to terminals T2 and T1 of the modulator 26 to transmit control signals. Thanks to the circuit arrangement of the transmitter 2, the extra pin (referring to pin t2 shown in FIG. 1D) to connect the output of the buffer amplifier to the modulator and the extra pin (referring to pin t4 shown in FIG. 1D) to connect the modulator to the input of the power amplifier in a conventional modulator are eliminated in the IC 28. The reduced pin numbers may advantageously minimize the harmonics or spurious signals and also save the package cost of the IC 28. Moreover, the modulator 26 is controlled by digital signals from the MCU 21 or the digital processor 22 and therefore the low pass filter used to convert digital signals to analog signals (see the low pass filter 15 as shown in FIG. 1C) may also be eliminated. In another example, the MCU 21 and the digital processor 22 may be integrated into a control circuit (not shown).

Figure 2B:
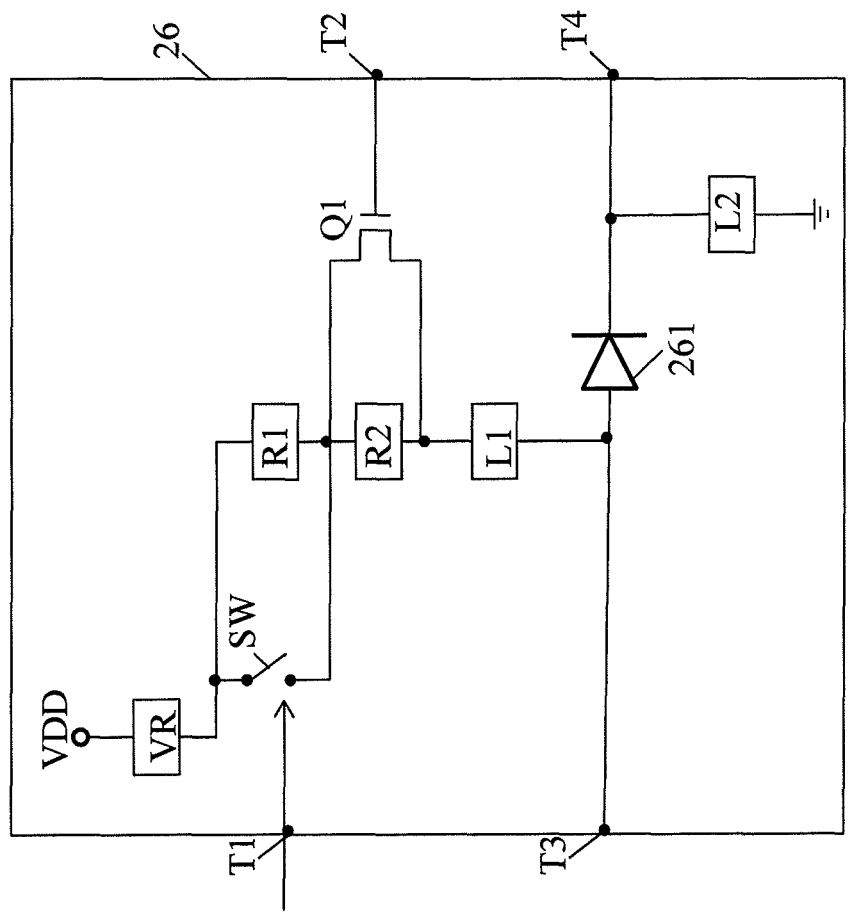
FIG. 2B is a block diagram further illustrating the modulator 26 as shown in FIG. 2A in accordance with an example of the present invention.

FIG. 2B is a block diagram further illustrating the modulator 26 as shown in FIG. 2A in accordance with an example of the present invention. Referring to FIG. 2B, the modulator 26 may include a variable resistor VR, two resistors R1 and R2, two inductors L1 and L2, a switch SW, a diode 261 and a transistor Q1.

The variable resistor VR may have a terminal connected to a voltage terminal VDD which may supply a direct current (DC) voltage level. Another terminal of the variable resistor VR may connect to the resistor R1 and the switch SW, which are connected in parallel. The switch SW may connect to the terminal T1 and then the digital processor 22. In this example, the switch SW may include but is not limited to a transistor. The resistor R2 may connect to the resistor R1 and the inductor L1 in series. The inductor L1 may have a terminal connected to the output of the power amplifier 25 and the anode of the diode 261 (i.e. terminal T3). The inductor L2 may have a terminal connected to the cathode of the diode 261 and the antenna 27 (i.e. terminal T4) and another terminal which is grounded. The transistor Q1 may have a first terminal connected to the terminal T2. The transistor Q1 may further have a second terminal and a third terminal and the resistor R2 may be connected between the second and third terminals of the transistor Q1. In one example, the transistor Q1 may be but is not limited to a complementary metal-oxide-semiconductor (CMOS) transistor. In another example, the diode 261 may be but is not limited to a p-intrinsic-n (PIN) diode.

Figure 3A:
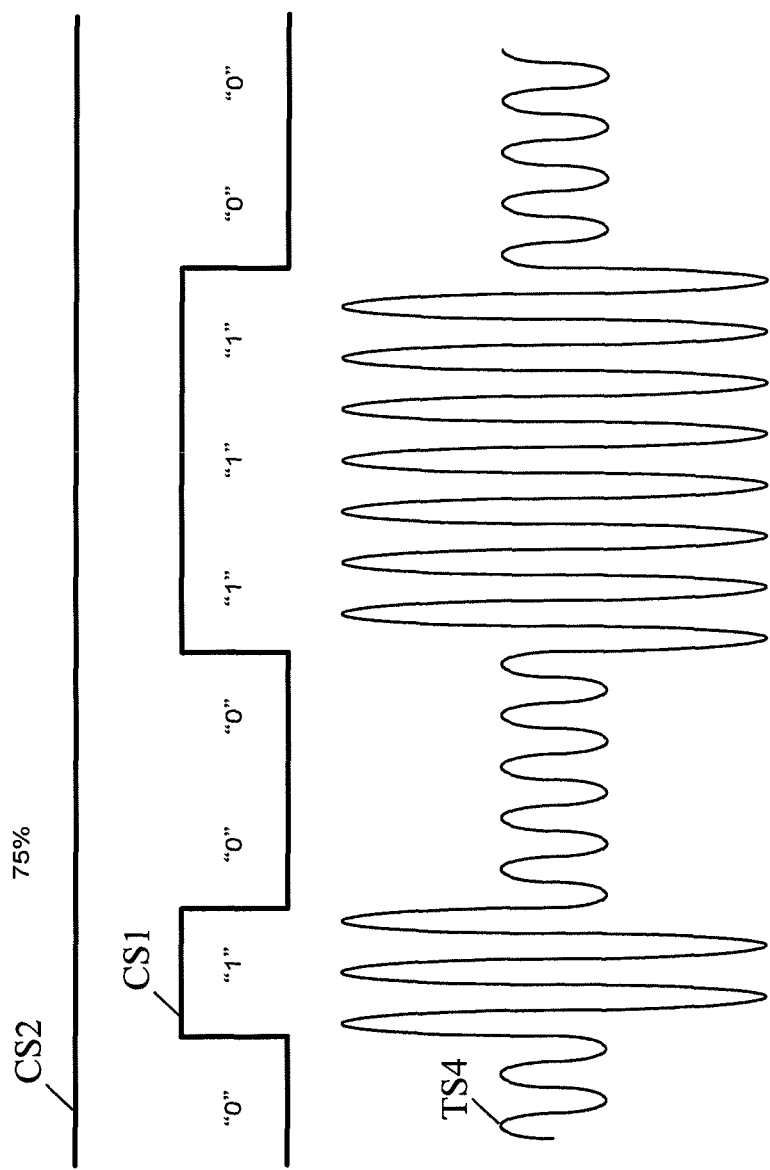
FIG. 3A illustrates a modulation scheme in accordance with an example of the present invention.

FIG. 3A illustrates a modulation scheme in accordance with an example of the present invention. Referring to FIG. 3A, a control signal CS1 from the digital processor 22 may be sent to terminal T1 (referring to FIG. 2B) to turn on/off the switch SW. In this example, when the control signal CS1 is relatively low, the switch SW is off, the modulator 26 may perform the ASK modulation. In other words, the digital processor 22 may determine whether or not the modulator 26 is going to perform the ASK modulation. When the control signal CS1 is relatively high, the switch SW is on and the modulator 26 may stop performing the ASK modulation. The digital processor 22 may send a control signal and control the frequency band of the signal TS4 in this manner.

Still referring to FIG. 3A, another control signal CS2 from the digital processor 22 may be sent to terminal T2 (referring to FIG. 2B) to change the modulation depth of the signal TS4. In this example, the control signal CS2 is relatively low and the modulator 26 may perform an ASK modulation with 75% modulation depth.

Figure 3B:
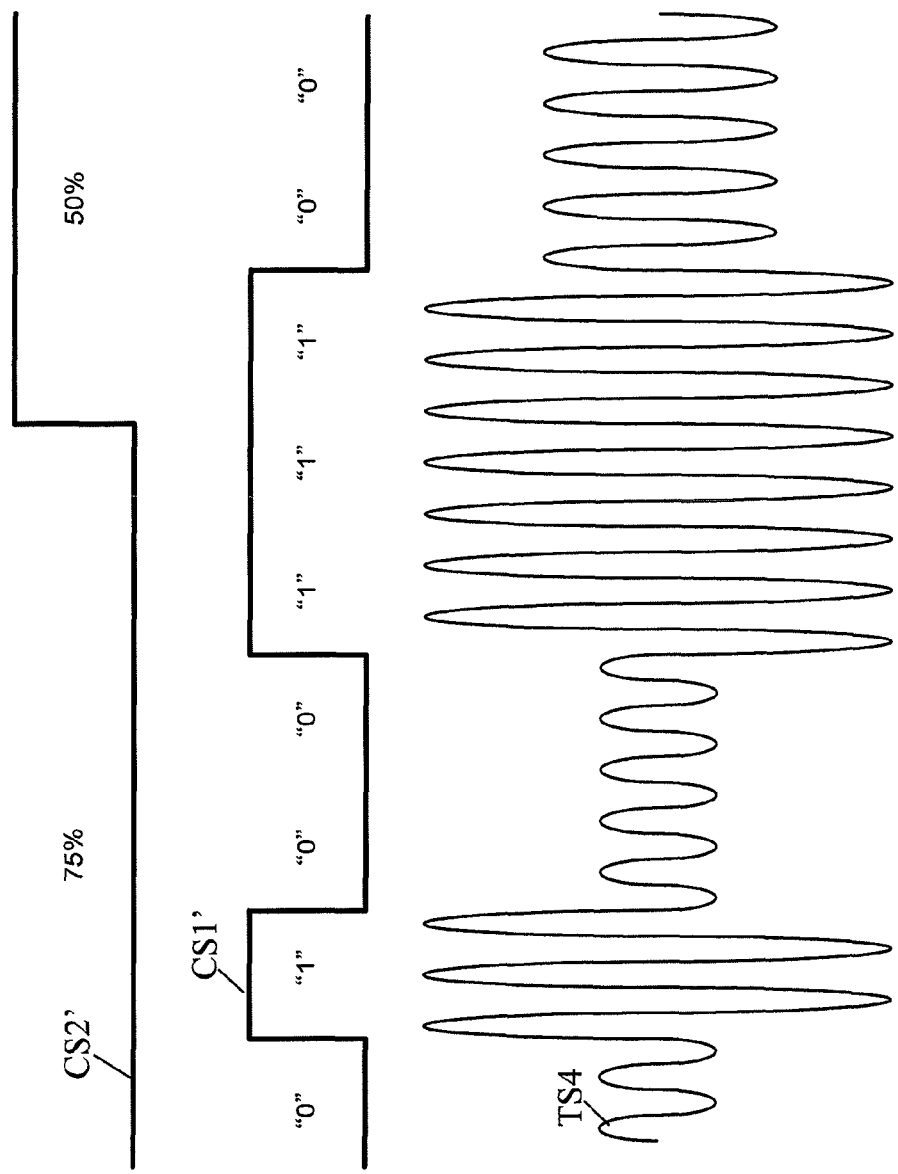
FIG. 3B illustrates a modulation scheme in accordance with an example of the present invention.

FIG. 3B illustrates a modulation scheme in accordance with an example of the present invention. Referring to FIG.

3B, a control signal CS1' from the digital processor 22 may be sent to terminal T1 (referring to FIG. 2B) to turn on/off the switch SW. In this example, when the control signal CS1' is relatively low, the switch SW is off, the modulator 26 may perform the ASK modulation. In other words, the digital processor 22 may determine whether or not the modulator 26 is going to perform the ASK modulation. When the control signal CS1' is relatively high, the switch SW is on and the modulator 26 may stop performing the ASK modulation. The digital processor 22 may control the frequency band of the signal TS4 in this manner.

Still referring to FIG. 3B, another control signal CS2' from the digital processor 22 or from an external device may be sent to terminal T2 (referring to FIG. 2B) to change the modulation depth of the signal TS4. In this example, when the control signal CS2' is relatively low and the modulator 26 may perform an ASK modulation with 75% modulation depth. When the control signal CS2' is relatively high and the modulator 26 may perform an ASK modulation with 50% modulation depth. The modulation depth may not be limited to the above but can be varied in other examples.

Referring back to FIG. 2B, in one example, the variable resistor VR may have a resistance in the range of 10Ω to 50 kΩ, each of the resistors R1 and R2 may have a resistance of 10 kΩ, each of the inductors L1 and L2 may have an inductance of 100 Nano-Henry (nh). However, the values of the above resistance and inductance may be varied in another example to change the modulation depth.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A modulator comprising:
    a first terminal to receive a carrier signal;
    a second terminal to receive a first control signal to control an ASK modulation of the carrier signal;
    a third terminal to receive a second control signal to control an ASK modulation depth of the carrier signal; and
    a PIN diode for signal modulation.

2. The modulator of claim 1, wherein the second terminal and the third terminal are connected to a control unit.

3. The modulator of claim 1, wherein the third terminal is connected to a direct current (DC) voltage source.

4. The modulator of claim 2, wherein the modulator further comprises a carrier generator and an amplification circuit connected between the carrier generator and the first terminal of the modulator, wherein the modulator has a fourth terminal connected to an antenna.

5. The modulator of claim 4, wherein the modulator comprises:
    a variable resistor being provided with a voltage level;
    a switch connected in series to the variable resistor and electrically coupled to the second terminal of the modulator;
    a first resistor connected in parallel to the switch;
    a second resistor connected in series to the first resistor;
    a first inductor having a first terminal connected to the second resistor and a second terminal to an output of the amplification circuit;
    the PIN diode having an anode connected to the output of the amplification circuit and the second terminal of the first inductor and an cathode connected to the antenna; and
    a second inductor having a first terminal connected to the cathode of the PIN diode and a second terminal, wherein the second terminal is grounded.

6. The modulator of claim 5 further comprises a transistor having a first terminal connected to the third terminal of the modulator, a second terminal and a third terminal, wherein the second resistor is connected between the second and third terminals of the transistor.

7. The modulator of claim 6, wherein the transistor is a metal-oxide-semiconductor (MOS) transistor.

8. The modulator of claim 2, wherein the modulator further comprises a carrier generator and an amplification circuit connected between the carrier generator and the first terminal of the modulator, wherein the modulator has a fourth terminal connected to an antenna and the amplification circuit comprises a buffer amplifier.

9. The modulator of claim 8, wherein the amplification circuit comprises a power amplifier in series connection to the buffer amplifier.

10. A transmitter comprising:
    a carrier generator for generating a carrier signal;
    an amplification circuit having an input terminal connected to the carrier generator;
    a modulator having a first terminal connected to an output of the amplification circuit; and
    an antenna having an input connected to the modulator,
    wherein the modulator comprises a second terminal to receive a first control signal to control an ASK modulation of the carrier signal; and
    wherein the modulator comprises a PIN diode for signal modulation, and
    wherein the modulator comprises a third terminal to receive a second control signal to control a modulation depth of the carrier signal.

11. The transmitter of claim 10, wherein the modulator comprises the third terminal connected to a direct current (DC) voltage source, the DC voltage source supplies a voltage level to the third terminal of the modulator to control the modulation depth of the carrier signal.

12. The transmitter of claim 10, wherein the modulator comprises:
    a variable resistor being provided with a voltage level;
    a switch connected in series to the variable resistor and electrically coupled to the second terminal of the modulator;
    a first resistor connected in parallel to the switch;
    a second resistor connected in series to the first resistor;

a first inductor having a first terminal connected to the second resistor and a second terminal to the output of the amplification circuit;

the PIN diode having an anode connected to the output of the amplification circuit and the second terminal of the first inductor and an cathode connected to the antenna; and a second inductor having a first terminal connected to the cathode of the PIN diode and a second terminal, wherein the second terminal is grounded.

13. A modulator comprising:

a variable resistor being provided with a voltage level;

a switch connected in series to the variable resistor;

a first resistor connected in parallel to the switch;

a second resistor connected in series to the first resistor;

a first inductor having a first terminal connected to the second resistor and a second terminal to receive a carrier signal;

a PIN diode having an anode connected to the second terminal of the first inductor and an cathode to output a modulated signal; and a second inductor having a first terminal connected to the cathode of the PIN diode and a second terminal, wherein the second terminal is grounded, wherein the switch receives a first control signal to control an ASK modulation of the carrier signal.

14. The modulator of claim 13, wherein the modulator further comprises a transistor having a first terminal, a second terminal and a third terminal, wherein the second resistor is connected between the second and third terminals.

15. The modulator of claim 14, wherein the first terminal of the transistor receives a second control signal to control a modulation depth of the carrier signal.

16. The modulator of claim 13, wherein the anode of the PIN diode and the second terminal of the first inductor are connected to an output of a power amplifier.

17. The modulator of claim 13, wherein the cathode of the PIN diode is connected to an antenna.

* * * * *